United States Patent [19]

Eimori et al.

[11] Patent Number: 5,067,000
[45] Date of Patent: Nov. 19, 1991

[54] SEMICONDUCTOR DEVICE HAVING FIELD SHIELD ISOLATION

[75] Inventors: Takahisa Eimori; Shinichi Satoh; Wataru Wakamiya; Hiroji Ozaki; Yoshinori Tanaka, all of Hyogo, Japan

[73] Assignee: Mitsubishi Denki Kabushiki Kaisha, Tokyo, Japan

[21] Appl. No.: 391,008

[22] Filed: Aug. 9, 1989

[30] Foreign Application Priority Data

Sep. 29, 1988 [JP] Japan ................................ 63-247672

[51] Int. Cl.⁵ ..................... H01L 29/40; H01L 27/01; H01L 29/10; H01L 27/02
[52] U.S. Cl. ..................................... 357/53; 357/23.1; 357/23.4; 357/47; 365/51; 365/53; 365/54
[58] Field of Search ..................... 357/53, 47, 45, 23.4, 357/23.1, 23.9; 365/53, 54, 51

[56] References Cited

U.S. PATENT DOCUMENTS

| 4,455,565 | 6/1984 | Goodman et al. | 357/23.4 |
| 4,486,943 | 12/1984 | Ryden et al. | 357/23.1 |
| 4,561,170 | 12/1985 | Doering et al. | 29/571 |
| 4,597,824 | 7/1986 | Shinada et al. | 357/23.4 |
| 4,654,691 | 3/1987 | Shirasawa et al. | 357/38 |
| 4,689,647 | 8/1987 | Nakagawa et al. | 357/23.4 |
| 4,696,092 | 9/1987 | Doering et al. | 437/5 |
| 4,728,617 | 3/1988 | Woo et al. | 357/23.9 |
| 4,736,342 | 4/1988 | Imondi et al. | 357/23.5 |

FOREIGN PATENT DOCUMENTS

| 60-169163 | 9/1985 | Japan | 357/53 |
| 62-162353 | 7/1987 | Japan | 357/53 |
| 62-244163 | 10/1987 | Japan | 357/53 |

OTHER PUBLICATIONS

Webster's II New Riverside University Dictionary, ©1984, p. 1206.
Ogura et al., "Design and Characteristics of the LDD Insulated Gate Field-Effect Transistor", IEEE Elec. Devices, 8/1980, pp. 1359-1367.
IEEE Transactions on Electron Devices, vol. 36, No. 4, Apr. 1989, "A High-Performance Directly Insertable Self-Aligned Ultra-Rad-Hard and Enhanced Isolation Field-Oxide Technology for Gigahertz Silicon NMOS/CMOS VLSI", Lalita Manchanda et al.

Primary Examiner—Andrew J. James
Assistant Examiner—Daniel Kim
Attorney, Agent, or Firm—Lowe, Price, LeBlanc and Becker

[57] ABSTRACT

A first conductor for a field shield and a first insulating film are sequentially formed in a predetermined shape on a major surface of a P-type semiconductor substrate through an insulating film. A third insulating film is formed over the semiconductor substrate so as to cover the first conductor and a second insulating film thereon. The third insulating film is anisotropically etched, so that a sidewall insulating film is formed on sidewalls of the first conductor. Second and third conductors respectively serving as gate electrodes of field effect transistors are formed through a fourth insulating film. N-type impurities are implanted into the major surface of the semiconductor substrate utilizing as masks the first insulating film, the sidewall oxide film, the second conductor and the third conductor and are diffused, to form impurity regions. Since the sidewall oxide film is thick, the impurity regions are not overlapped even by diffusion with a portion where the first conductor is projected on the semiconductor substrate. Thus, a threshold voltage of a field shield transistor comprising the first conductor and the impurity regions on both sides thereof is raised, so that isolation characteristics of the field shield is improved.

13 Claims, 15 Drawing Sheets

FIG.13E          PRIOR ART
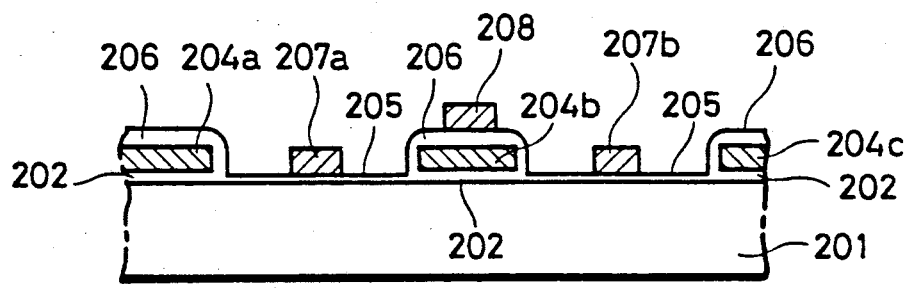
FIG.13F          PRIOR ART
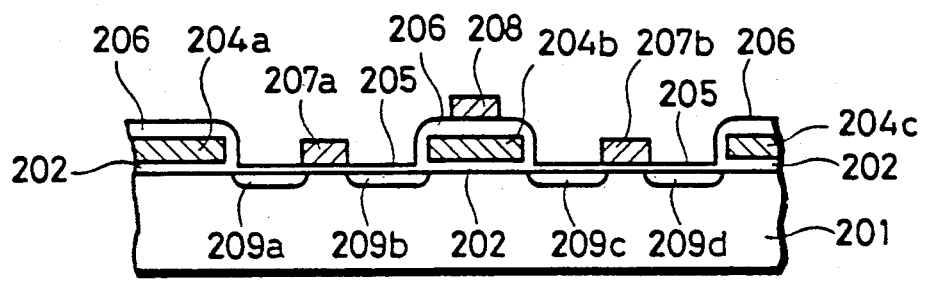
FIG.13G          PRIOR ART
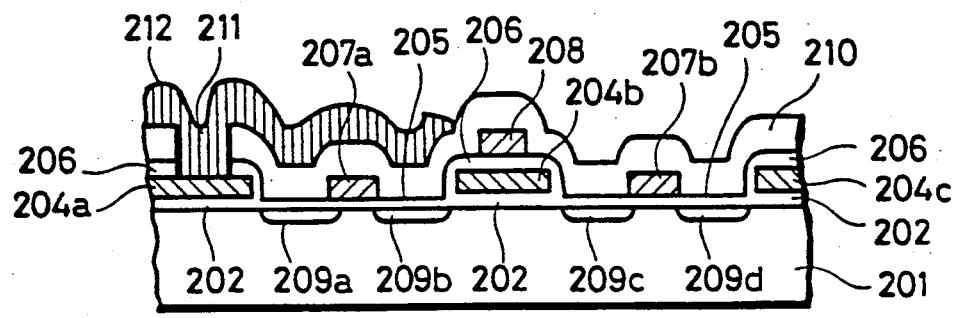

SEMICONDUCTOR DEVICE HAVING FIELD SHIELD ISOLATION

BACKGROUND OF THE INVENTION

1. Field of the Invention

The present invention relates generally to semiconductor devices, and more particularly, to a semiconductor device having improved field shield isolation for electrically isolating devices formed on a common substrate.

2. Description of the Background Art

Conventionally, a method for isolating semiconductor devices has generally used an LOCOS (Local Oxidation of Silicon) process which is disclosed in, for example, Japanese Patent Laying-Open Gazette No. 190869/1987.

FIG. 10 is a cross-sectional view showing a structure for isolation using this LOCOS process.

In FIG. 10, isolation oxide films 52a and 52b are formed at predetermined spacing so as to define an active region on a major surface of a p-type semiconductor substrate 51. n+-type impurity regions 54a and 54b are formed at predetermined spacing in the active region. A gate electrode 55 is formed over the major surface of the semiconductor substrate 51 serving as a channel region between the impurity regions 54a and 54b through an insulating film. An interlayer insulating film 56 is formed on an entire major surface of the semiconductor substrate 51 so as to cover the gate electrode 55. An interconnection layer 57 is formed on the interlayer insulating film 56. The gate electrode 55 and the impurity regions 54a and 54b constitute a field effect transistor Tr.

Thus, the isolation oxide films 52a and 52b are formed to electrically isolate a region where this transistor is formed from another active region. However, bird's beaks 53a and 53b peculiar to the LOCOS process are formed in respective ends of the isolation oxide films. Each of the isolation oxide films extends into the active region by a length c due to the bird's beaks 53a and 53b. This brings about the narrow channel effect by which a threshold value of a field effect transistor becomes larger as the channel length thereof is decreased when isolation oxide films are formed in a channel width direction of the transistor. There are limitations of the application of the LOCOS process to fine isolation with higher integration density of the semiconductor device due to the above described length c.

FIG. 11 is a cross-sectional view showing a structure produced by field shield isolation used as isolation which can correspond to miniaturization of devices.

The structure shown in FIG. 11 is disclosed in Japanese Patent Laying Open No. 47437/1985. In FIG. 11, n+-type impurity regions 104a and 104b are formed at predetermined spacing on a major surface of a p-type semiconductor substrate 101. A gate electrode 106 is formed over a channel region of the semiconductor substrate 101 between the impurity regions 104a and 104b through an insulating film 102. The gate electrode 106 and the impurity regions 104a and 104b constitute a field effect transistor Tr. Field shield electrodes 109a and 109b are respectively formed through the insulating film 102 in regions outside of the impurity regions 104a and 104b, i.e., above portions corresponding to the regions where the isolation oxide films are respectively formed in FIG. 10. Since the field shield electrodes 109a and 109b are respectively connected to ground power supplies 113a and 113b through variable power supplies 112a and 112b, each of the field shield electrodes 109a and 109b is held at a negative potential. An interlayer insulating film 110 is formed over an entire surface to cover the gate electrode 106 and the field shield electrodes 109a and 109b.

Isolation between devices is achieved by holding the field shield electrodes 109a and 109b at a negative potential as described above such that the conductivity type of a region on a major surface of the semiconductor substrate 101 below the field shield electrodes is not reversed.

FIGS. 12A through 12F are cross-sectional views showing the steps of a method for manufacturing the semiconductor device shown in FIG. 11.

Referring now to FIGS. 12A to 12F, the manufacturing method therefor will be described.

An oxide film 102 and a polysilicon (polycrystalline silicon) layer 103 of a predetermined thickness are sequentially formed on a major surface of a p-type semiconductor substrate 101 as shown in FIG. 12A.

The polysilicon layer 103 and the oxide film 102 are patterned using photolithographic techniques, to form polysilicon patterns 103a, 103b and 106 at predetermined spacing. Within the prescribed spacing produced by patterning, n-type impurities are implanted into the semiconductor substrate 101 exposed by the patterning, to form n+-type impurity regions 104a and 104b as shown in FIG. 12B.

Then, the polysilicon patterns 103a and 103b are removed by etching process using a mask of resist pattern which covers the pattern 106 (see FIG. 12C), and an oxide film 107 is formed on an entire surface of the semiconductor substrate 101 so as to cover the remaining polysilicon pattern 106 as shown in FIG. 12D.

Then, a polysilicon layer 108 is formed on an entire surface of the oxide film 107 by CVD process as shown in FIG. 12E, and the polysilicon layer 108 is patterned in a predetermined position using photolithographic techniques, to form polysilicon patterns 109a and 109b each serving as a field shield electrode as shown in FIG. 12F.

The semiconductor device having the structure shown in FIG. 11 is completed through the steps of further forming an interlayer insulating film and an interconnection layer.

Meanwhile, in the above described manufacturing method, the field shield electrodes 109a and 109b are patterned after impurity regions 104a and 104b serving as a source-drain region are formed. Therefore, high-precision mask alignment is required to form field shield electrodes. Thus, the manufacturing method is not necessarily suitable for miniaturization of devices. In addition, since the oxide films 102 and 107 under the field shield electrodes 109a and 109b are formed through two steps (FIGS. 12C and 12D), the reliability as a field effect transistor is decreased if a field shield electrode is considered as a gate electrode of a transistor for isolation.

As a partial solution to these problem, a method for manufacturing a semiconductor device in which impurity regions serving as a source-drain region are formed by self-alignment utilizing a field shield electrode as a mask is disclosed in, for example, Japanese Patent Laying-Open No. 162353/1987.

FIGS. 13A to 13G are cross-sectional views showing the steps of the manufacturing method disclosed in the above described gazette.

Referring now to FIGS. 13A to 13G, the manufacturing method will be described.

An oxide film 202 of a predetermined thickness is formed on a major surface of a p-type semiconductor substrate 201 as shown in FIG. 13A and then, a polysilicon layer 203 of a predetermined thickness is formed thereon as shown in FIG. 13B.

The polysilicon layer 203 is patterned using photolithographic techniques, to form polysilicon patterns 204a, 204b and 204c at predetermined spacing as shown in FIG. 13C.

Then, the exposed oxide film 202 is removed by an etching process using the patterns 204a, 204b and 204c as masks and then, an oxide film 205 is formed on the major surface of the semiconductor substrate 201 and an oxide film 206 is formed on upper surfaces and side surfaces of the polysilicon film patterns 204a, 204b and 204c by thermal oxidation as shown in FIG. 13D.

A polysilicon layer is formed on an entire surface of the oxide films 205 and 206 and is patterned using photolithographic techniques, so that polysilicon film patterns 207a and 207b are formed on the oxide film 205 and a polysilicon film pattern 208 is formed on the oxide film 206 as shown in FIG. 13E.

Then, n-type impurities are implanted into the major surface of the semiconductor substrate 201 through the exposed oxide film 205 and are diffused, to form impurity regions 209a, 209b, 209c and 209d as shown in FIG. 13F.

Additionally, an interlayer insulating film 210 is formed on an entire surface to cover the polysilicon film patterns 207a, 207b and 208, so that a contact hole 211 is formed such that a part of the polysilicon film pattern 204a is exposed. A metal layer is formed on the interlayer insulating film 210 including the inside of the contact hole 211 and is patterned, so that a metal interconnection 212 is formed as shown in FIG. 13G.

As described in the foregoing, in the above described method, since a field shield electrode has been already formed before impurity regions serving as a source-drain region are formed, the impurity regions are formed by self-alignment, so that high-precision mask alignment is not required. Thus, the above described method is suitable for high integration density of devices.

FIG. 14 is a cross-sectional view showing a structure around a field shield electrode in a semiconductor device in the above described manufacturing method shown in FIGS. 13A to 13G and an enlarged view of portions shown in FIG. 13G.

In FIG. 14, a polysilicon film pattern 207a serving as a gate electrode and impurity regions 209a and 209b serving as a source-drain region constitute a field effect transistor Tr.1. On the other hand, a polysilicon film pattern 207b serving as a gate electrode and impurity regions 209c and 209d serving as a source-drain region constitute a field effect transistor Tr.2. Meanwhile, the impurity region 209b in the transistor Tr.1, the impurity region 209c in the transistor Tr.2, and a polysilicon film pattern 204b serving as a field shield electrode constitute a field transistor FTr. Thus, an active region where the transistor Tr.1 is formed and an active region where the transistor Tr.2 is formed are isolated by holding the field shield electrode 204b at a predetermined potential so that the transistor FTr. always remains off. However, as shown in FIG. 14, in many cases, a conductor 208 serving as an interconnection layer is formed over the field shield electrode 204b through an insulating film 206. Therefore, there is no problem when the field shield electrode 204b is always held at a negative potential by connection to the power supply as shown in FIG. 11, while there occurs a problem when the potential thereof is electrically floating. More specifically, when the field shield electrode 204b is electrically floating, a capacitance is formed between the field shield electrode 204b and the conductor 208 by a potential applied to the conductor 208, so that the potential of the field shield electrode 204b is changed. In FIG. 14, since the field transistor FTr. is an N channel transistor, the field shield electrode 204b is raised to a predetermined potential or more. Thus, this transistor is turned on when a potential of the impurity region 209c is $V_D$ and a potential of the impurity region 209b is a ground potential. In particular, since this transistor FTr. is an overlap type transistor, the threshold value thereof is small, so that the above described problem becomes significant. More specifically, in the state shown in FIG. 13F, the oxide film 206 on the sidewalls of the field shield electrode 204b is thin because it is formed by thermal oxidation. Impurities are implanted utilizing as masks the field shield electrode 204b and the oxide film 206. Therefore, the impurity regions 209b and 209c formed by thermal diffusion of the impurities extend into a region under the field shield electrode 204b, that is, are overlapped with the field shield electrode 204b in the perpendicular direction to the major surface of the semiconductor substrate 201 (see a length a of the overlap portion). The thickness of $SiO_2$ on polysilicon 204b formed by oxidation of polysilicon results in greater thickness than $SiO_2$ layer 205. The thickness typically depends on impurity concentration by a layer having a few times thickness. Since the layer 205 will form the gate insulator of an FET, it must be limited in thickness, for example to approximate 200Å. Therefore, the thickness of the oxide film 206 formed on opposite sides of the electrode 204b will be limited to about 1000Å. This lateral distance is insufficient to prevent diffusion of implanted impurities into a region under the field shield electrode during necessary subsequent thermal annealing. Since the transistor FTr. has the same structure as that of the ordinary field effect transistor for an on-off operation, the threshold voltage thereof is small, so that the transistor FTr. is likely to be erroneously turned on. As a result, the reliability for isolation is decreased.

SUMMARY OF THE INVENTION

An object of the present invention is to improve the reliability for isolation in a semiconductor device having field shield isolation.

Another object of the present invention is to make it difficult to reverse a conductivity type of a semiconductor substrate in a portion where field shield isolation is achieved, in a semiconductor device having field shield isolation.

Still another object of the present invention is not to overlap impurity regions with a portion where a conductor for field shield isolation is projected on a semiconductor substrate, in a method for manufacturing a semiconductor device having field shield isolation.

In order to attain the above described objects, the present invention is directed to a semiconductor device for electrically isolating a first device and a second device formed on a common semiconductor substrate, which comprises a semiconductor substrate, first and second impurity regions and a conductor. The semiconductor substrate has a major surface and is of a first conductivity type. The first and second impurity regions are formed on the major surface of the semiconductor substrate at predetermined spacing, and is of a second conductivity type opposite to the first conductivity type. The first impurity region is included in the first device, and the second impurity region is included in the second device. The conductor is formed above a region on the semiconductor substrate between the first and second impurity regions and over the major surface of the semiconductor substrate through an insulating film. A portion where the conductor is projected on the major surface of the semiconductor substrate is not overlapped with at least one of the first and second impurity regions.

In order to attain the above described objects, a method for manufacturing a semiconductor device according to the present invention prepares a semiconductor substrate of a first conductivity type having a major surface, forms a first conductor having a predetermined shape on the semiconductor substrate through a first insulating film and form a second insulating film on the first conductor, forms a third insulating film on the major surface of the semiconductor substrate to cover the first conductor and the second insulating film, removes the third insulating film by anisotropic etching to expose the major surface of the semiconductor substrate and form a sidewall insulating film on the sidewalls of the first insulating film, the first conductor and the second insulating film, implants impurities of a second conductivity type opposite to the first conductivity type into the exposed major surface of the semiconductor substrate utilizing as masks the second insulating film and the sidewall insulating film, and forms at least one impurity region such that a boundary portion thereof is not overlapped with a portion where the first conductor is projected on the major surface of the semiconductor substrate.

The semiconductor device structured as described above does not have overlap portions between a conductor constituting a field transistor and first and second impurity regions, so that the threshold voltage thereof is raised.

In a method for manufacturing a semiconductor device structured as described above, an insulating film is formed on sidewalls of a conductor for field shield isolation and then, impurities are implanted and diffused utilizing the insulating film as a mask, so that impurity regions are not overlapped with a portion where the conductor is projected on a semiconductor substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13A to 13G are diagrams showing the steps of a method for manufacturing a semiconductor device having a structure for field shield isolation according to another conventional example.

DESCRIPTION OF THE PREFERRED EMBODIMENTS

Figure 1:
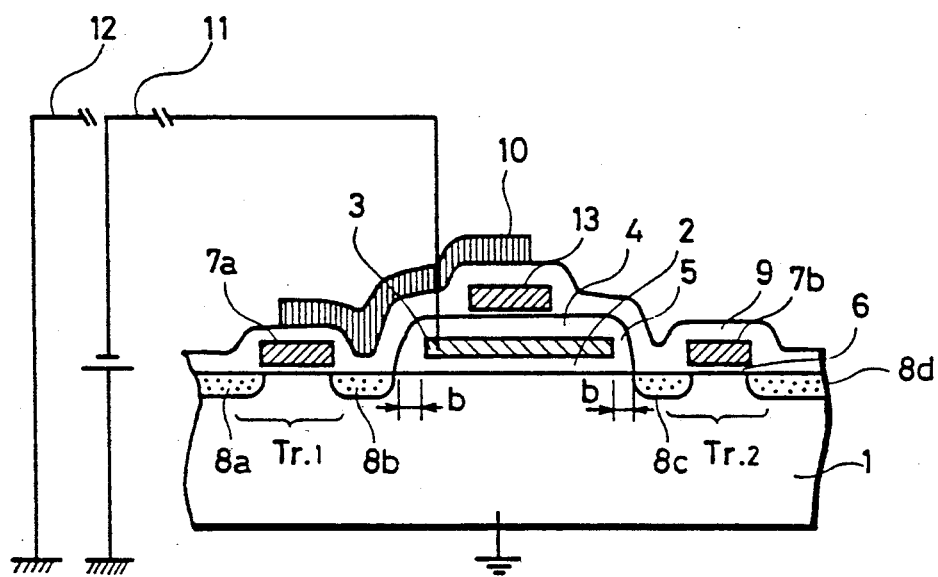
FIG. 1 is a cross-sectional view showing a structure including a field shield electrode according to one embodiment of the present invention.

FIG. 1 is a cross-sectional view showing a structure for field shield isolation according to one embodiment of the present invention.

In FIG. 1, n+-type impurity regions 8a, 8b, 8c and 8d are formed at predetermined spacing on a major surface of a p-type semiconductor substrate 1 connected to a ground potential. A gate electrode 7a is formed over a region between the impurity regions 8a and 8b through a gate oxide film 6. The gate electrode 7a and the impurity regions 8a and 8b constitute a field effect transistor Tr.1. A gate electrode 7b is formed over a region between the impurity regions 8c and 8d through the gate oxide film 6. The gate electrode 7b and the impurity regions 8c and 8d constitute a field effect transistor Tr.2. A field shield electrode 3 is formed through an insulating film 2 over a region between the impurity regions 8b and 8c and decreased widthwise by a length b. The field shield electrode 3 is covered with an interlayer insulating film 4 including a sidewall insulating film 5, and an interconnection layer 13 is formed thereon. An interlayer insulating film 9 is formed on an entire surface to cover the gate electrodes 7a and 7b and the interconnection layer 13, and an interconnection layer 10 is further formed thereon. The field shield electrode 3 is connected to a negative potential connecting line 11 or a ground potential connecting line 12.

Figure 14:
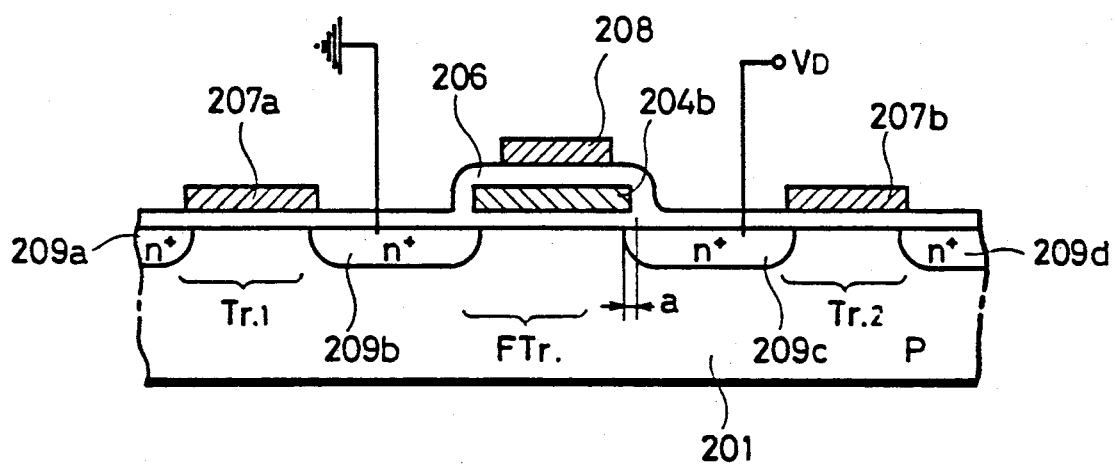
FIG. 14 is a cross-sectional view showing electrical characteristics around a field shield electrode shown in FIG. 13G.

As described in the foregoing, there is no overlap portion corresponding to the portion a as shown in FIG. 14 between the field shield electrode 3 and each of the impurity regions 8b and 8c, resulting in an offset state in which the field shield electrode is spaced apart from the impurity regions 8b and 8c by the length b. More specifically, the projection of the field shield electrode 3 on the major surface of the semiconductor substrate 1 does not overlap the impurity regions 8b and 8c.

Figure 2:
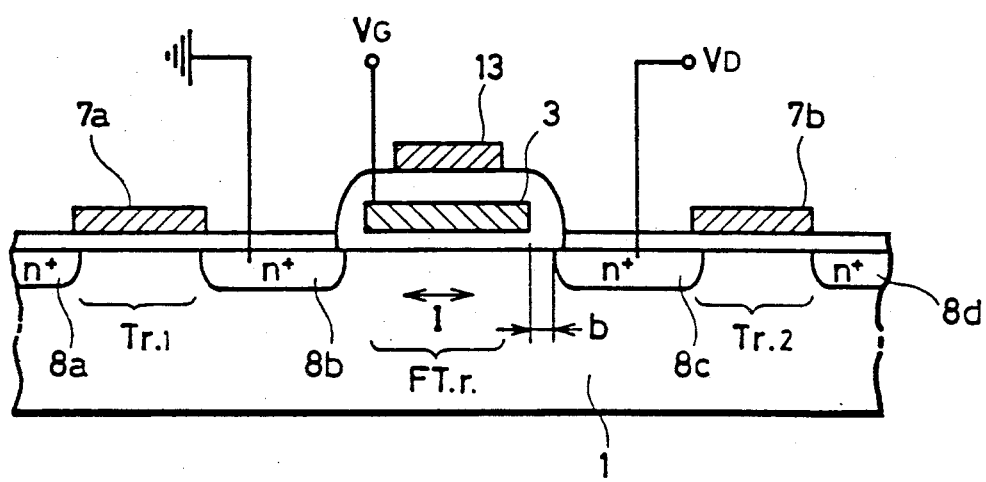
FIG. 2 is a diagram for explaining electrical characteristics of a field transistor shown in FIG. 1.

FIG. 2 is an enlarged view for explaining a structure around the field shield electrode shown in FIG. 1.

As shown in FIG. 2, a field shield electrode 3 and impurity regions 8b and 8c constitute a field transistor FTr. In order to describe electrical characteristics of the field transistor FTr., it is assumed here that a potential $V_G$, a potential $V_D$ and a ground potential are respectively connected to the field shield electrode 3, the impurity region 8c and the impurity region 8b.

Figure 3:
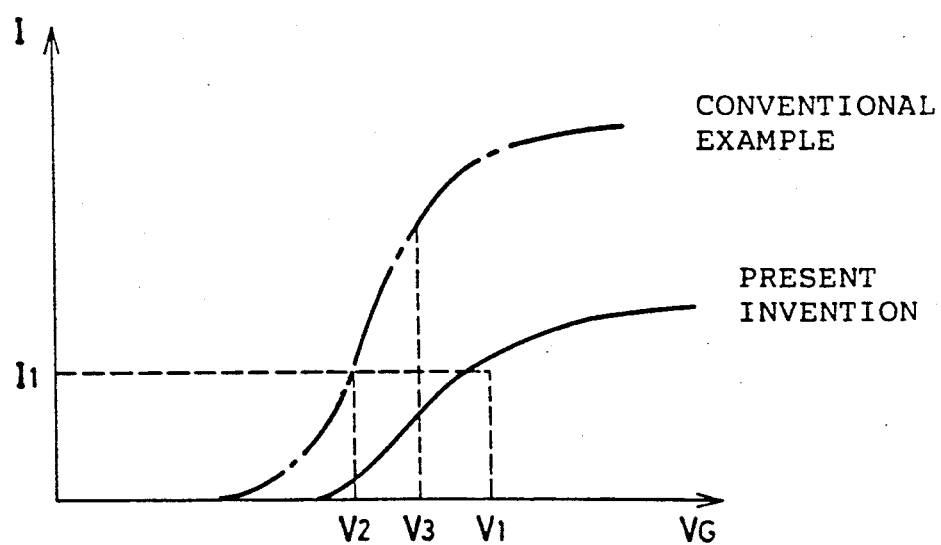
FIG. 3 is a diagram showing voltage-current characteristics of the field transistor shown in FIG. 2.

FIG. 3 is a diagram showing electrical characteristics of the field transistor shown in FIG. 2.

In FIG. 3, a potential $V_G$ of the field shield electrode and a current value I of the field transistor should be read along the axis of abscissa and the axis of ordinate, respectively. In FIG. 3, a solid line represents one embodiment of the present invention, and a dot and dash line represents the conventional example shown in FIG. 14. As shown in FIG. 3, a current value defining a threshold voltage is taken as a constant value $I_1$, a threshold value of the field transistor according to the present embodiment becomes $V_1$ while a threshold value of the field transistor according to the conventional example becomes $V_2$. As is clear from FIG. 3, the relation $V_1 > V_2$ is satisfied. Thus, when a voltage $V_3$ ($V_1 > V_3 > V_2$) is applied to the field shield electrode 3, the field transistor according to the conventional example is turned on, while the field transistor according to one embodiment of the present invention is not turned on.

FIGS. 4A to 4E are cross-sectional views showing the steps of a method for manufacturing a structure for field shield isolation according to one embodiment of the present invention.

Referring now to FIGS. 4A to 4E, the manufacturing method will be described.

Figure 4A:
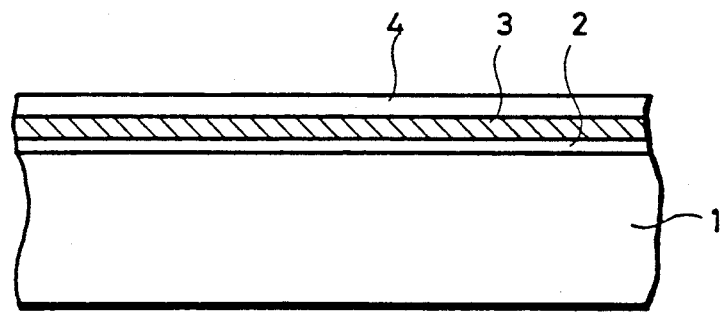
FIGS. 4A to 4E are schematic cross-sectional views showing the steps of a method for manufacturing a semiconductor device shown in FIG. 1.

First, an oxide film 2 of a predetermined thickness is formed on a major surface of a semiconductor substrate 1 comprising a p-type silicon substrate. A polysilicon film 3 having a thickness of about 1500 to 2000Å is formed on an entire surface of the oxide film 2 by an LPCVD (low-pressure chemical vapor deposition) process, and an oxide film 4 having a thickness of 3000Å is further formed thereon by, for example, a CVD process as shown in FIG. 4A.

Figure 4B:
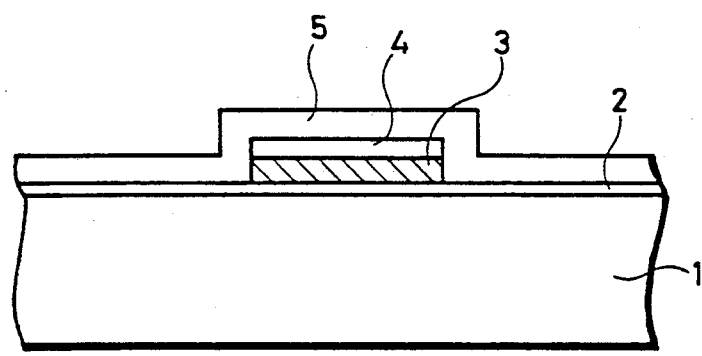

Then, the oxide film 4 and the polysilicon film 3 are patterned to a predetermined size using photolithdgraphic techniques, and a high temperature oxide film 5 is formed on the entire surface of the oxide film 2 to the thickness of about 3000Å so as to also cover the oxide film 4 and the polysilicon film 3 as shown in FIG. 4B.

Figure 4C:
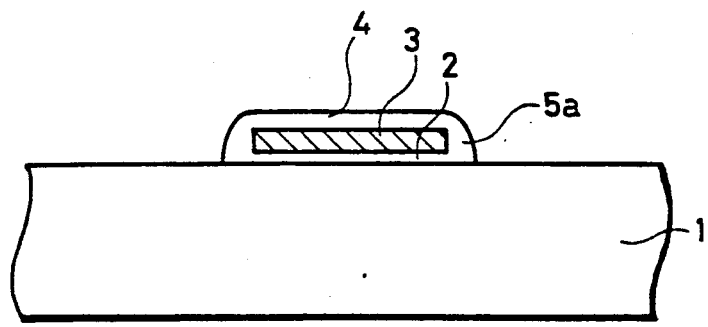

Then, the oxide film 5 is anisotropically etched using an RIE (reactive ion etching) process until the semiconductor substrate 1 is exposed. Consequently, a sidewall oxide film 5a is formed on sidewalls of the polysilicon film pattern 3 serving as a field shield electrode and the oxide film pattern 4 as shown in FIG. 4C.

In this case, the width of the sidewall oxide film 5a (in a right and left direction in the figure) can be controlled depending on the thickness of the oxide film 5, and the time required for RIE etching. In addition, the thickness of the oxide film 4 on the field shield electrode 3 can be controlled independently of the sidewall oxide film 5a because it depends on the thickness of the oxide film 4 in FIG. 4A.

Then, an oxide film and a polysilicon film are sequentially deposited on the exposed major surface of the semiconductor substrate 1 and the entire surface of the oxide film 4 and are patterned using photolithographic techniques, so that a polysilicon film pattern 7a serving as a gate electrode of the transistor Tr.1, a polysilicon film pattern 7b serving as a gate electrode of the transistor Tr.2 and a polysilicon film pattern 13 serving as an interconnection layer are formed through an insulating film. $n^+$-type impurities are implanted into the exposed major surface of the semiconductor substrate 1 and are diffused, so that impurity regions 8a and 8b, 8c and 8d are formed. On this occasion, the impurity regions 8b and 8c are diffused in right and left directions by the diffusion of the impurities. However, the sidewall oxide film 5a formed on sidewalls of the field shield electrode 3 is thick, so that the impurity regions 8b and 8c are not overlapped with the field shield electrode 3 in the perpendicular direction to the major surface of the semiconductor substrate 1. Consequently, the projection part of the field shield electrode 3 to the substrate 1 and each of the impurity regions 8b and 8c are in an offset state in which they are spaced apart from each other by a length b as shown in FIG. 4D.

Figure 4D:
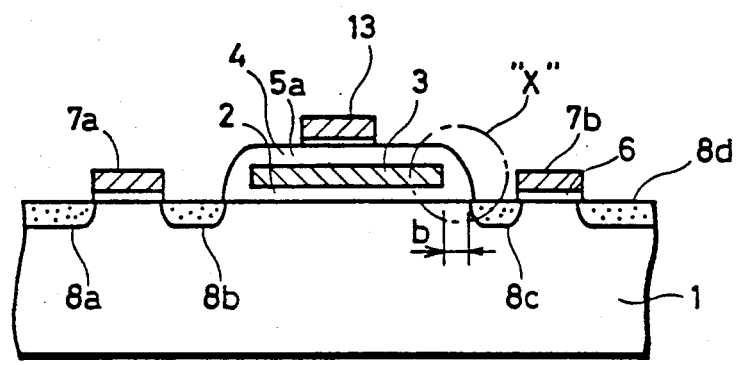
Figure 4E:
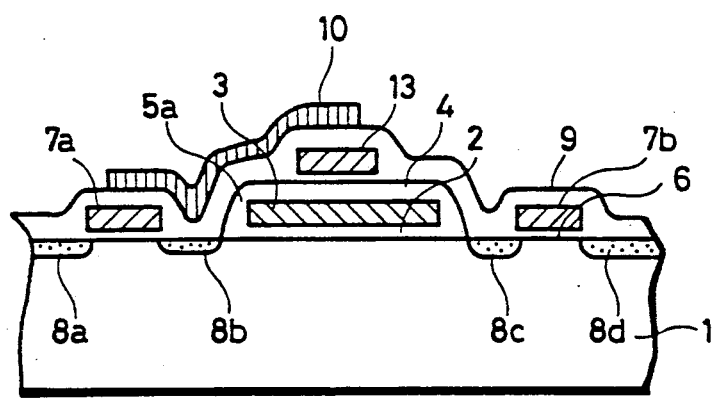
Figure 5:
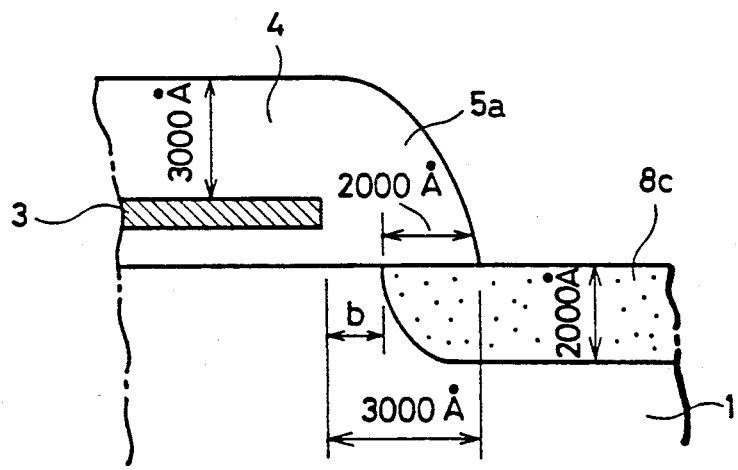
FIG. 5 is an enlarged view showing the "X" part in FIG. 4D.

In this place, FIG. 5 is an enlarged view showing the "X" part in FIG. 4D and concrete dimension of each sectional part is described. These dimensions show values of an example and actually vary dependent on a kind of implanted ion, implanted amount, a condition of the thermal treatment performed after implantation and the like. In this embodiment, the dimension b is 1000Å and therefore, the field shield electrode 3 is separated from the impurity region 8c without overlapping.

Finally, a BPSG (borophosphosilicate glass) film 9 having a thickness of about 8000Å is deposited on the entire surface so as to cover the gate electrodes 7a and 7b and the interconnection layer 13 and then, a metal interconnection 10 is further formed in a desired position on the BPSG film 9, so that the semiconductor device shown in FIG. 1 is completed.

Although in the above described embodiment, a transistor as one of devices to be isolated by a field shield electrode has a single drain structure, this transistor may have an LDD (lightly doped drain-source) structure.

Figure 6A:
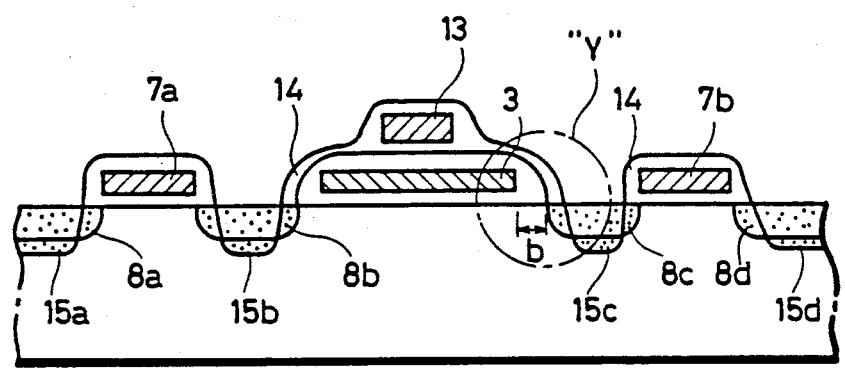
FIGS. 6A to 6B are schematic cross-sectional views showing the steps of a method for manufacturing a semiconductor device according to another embodiment of the present invention.
Figure 6B:
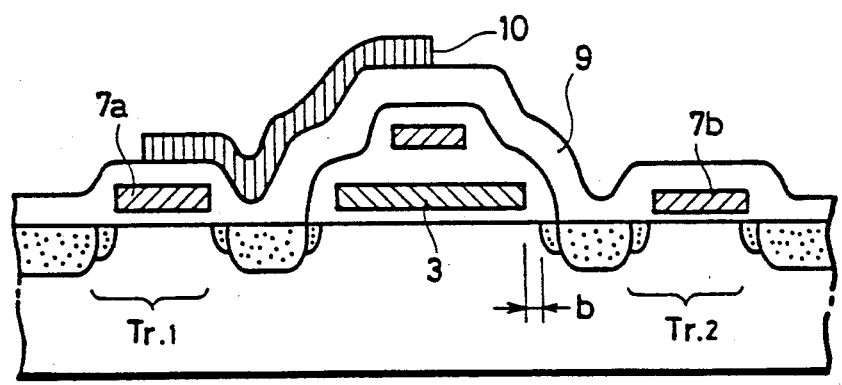

FIGS. 6A and 6B are cross-sectional views showing a part of the steps of a method for manufacturing a semiconductor device according to another embodiment of the present invention, showing a transistor having an LDD structure.

The manufacturing method according to the present embodiment comprises the steps shown in FIGS. 6A and 6B subsequent to the same steps as those shown in FIGS. 4A to 4D in the above described embodiment.

After the steps shown in FIGS. 4A to 4D are completed, a high temperature oxide film is formed on an entire surface so as to cover gate electrodes 7a and 7b and an interconnection layer 13 and is anisotropically etched until a part of a major surface of a semiconductor substrate 1 is exposed. A sidewall oxide film 14 remains on sidewalls of the gate electrodes 7a and 7b by this etching. n-type impurities are implanted into the exposed major surface of the semiconductor substrate 1. The concentration of the impurities is higher than that of the impurities implanted in FIG. 4D. As a result, n-type impurity diffused regions 15a, 15b 15c and 15d of a high concentration are formed, which, together with previously diffused impurity regions 8a, 8b, 8c and 8d, form LDD structures, respectively as shown in FIG. 5A.

Figure 7:
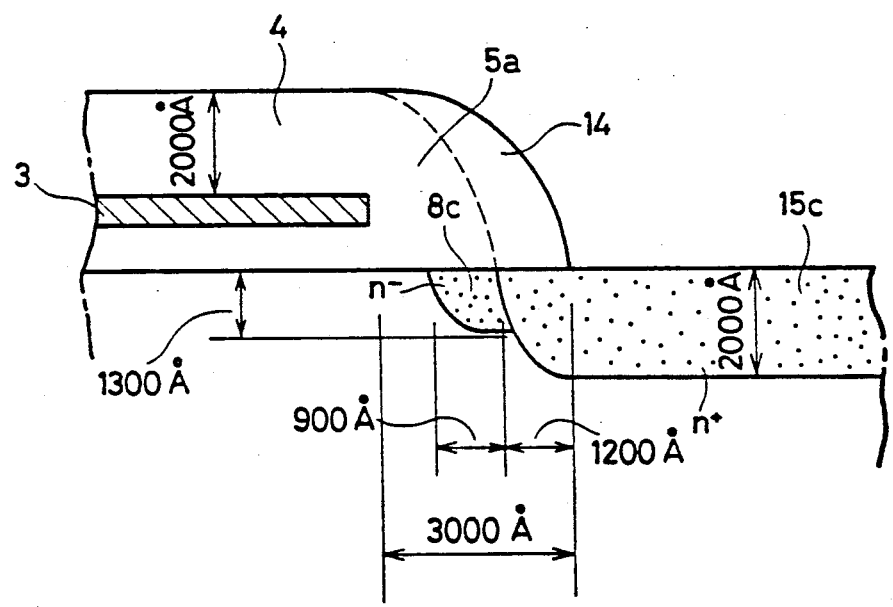
FIG. 7 is an enlarged view showing the "Y" part in FIG. 6A.

In this place, FIG. 7 is an enlarged view showing the "Y" part in FIG. 6A and concrete dimension of each sectional part is described. These dimensions show values of an example and actually vary dependent on a kind of implanted ion, implanted amount, a condition of the thermal treatment performed after implantation and the like. In this embodiment, the dimension b is 900Å and therefore the field shield electrode 3 is separated from the impurity region 8c without overlapping.

Similarly, a BPSG film 9 of a predetermined thickness is deposited on the entire surface and a metal interconnection 10 is further formed thereon, to complete a semiconductor device having a field shield structure by which transistors each having an LDD structure are isolated as shown in FIG. 6B.

Figure 8:
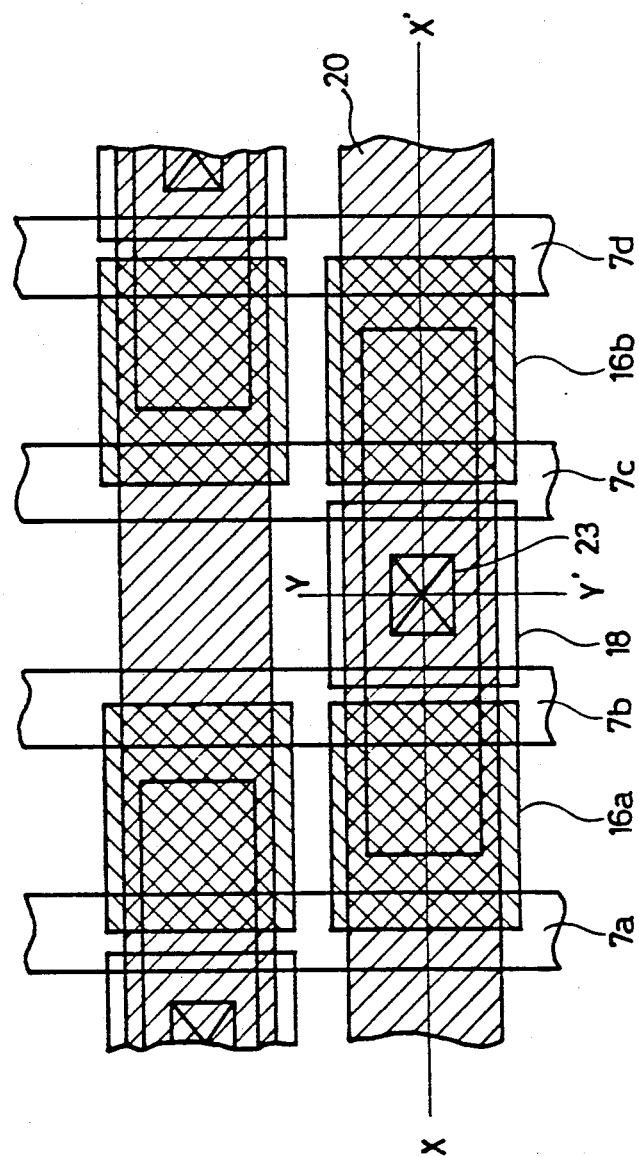
FIG. 8 is a plan view of a memory cell according to another embodiment shown in FIGS. 6A and 6B.
Figure 9A:
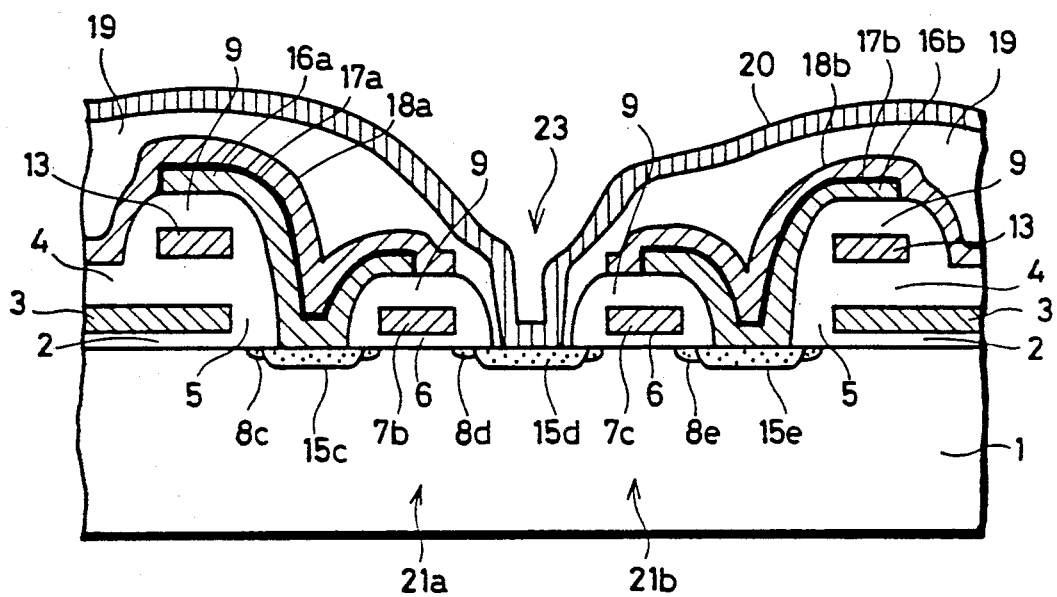
FIGS. 9A and 9B are drawings showing X—X' and Y—Y' sections of FIG. 8, respectively.
Figure 9B:
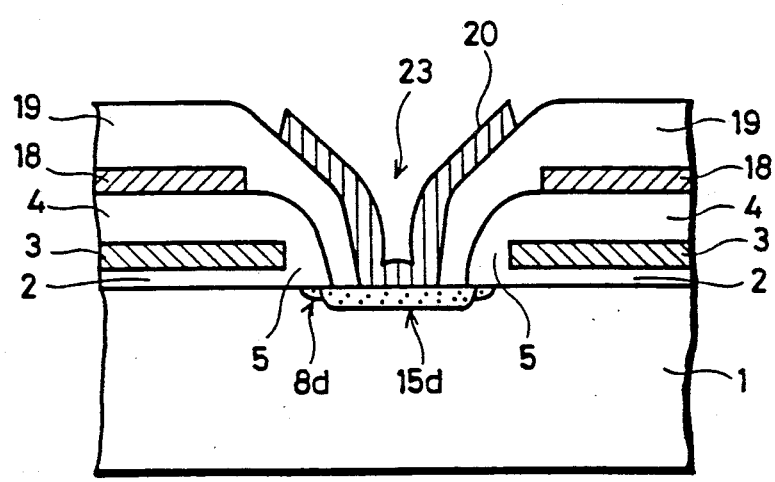
Figure 10:
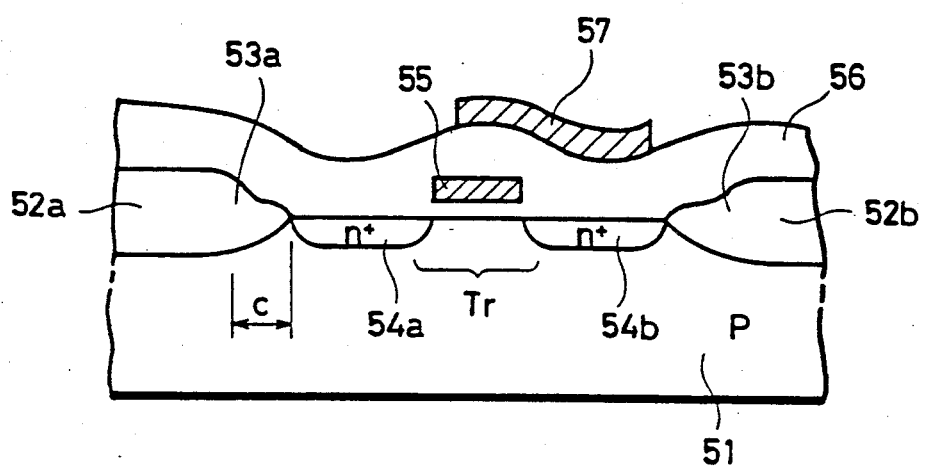
FIG. 10 is a cross-sectional view showing a structure for isolation using a conventional LOCOS process.
Figure 11:
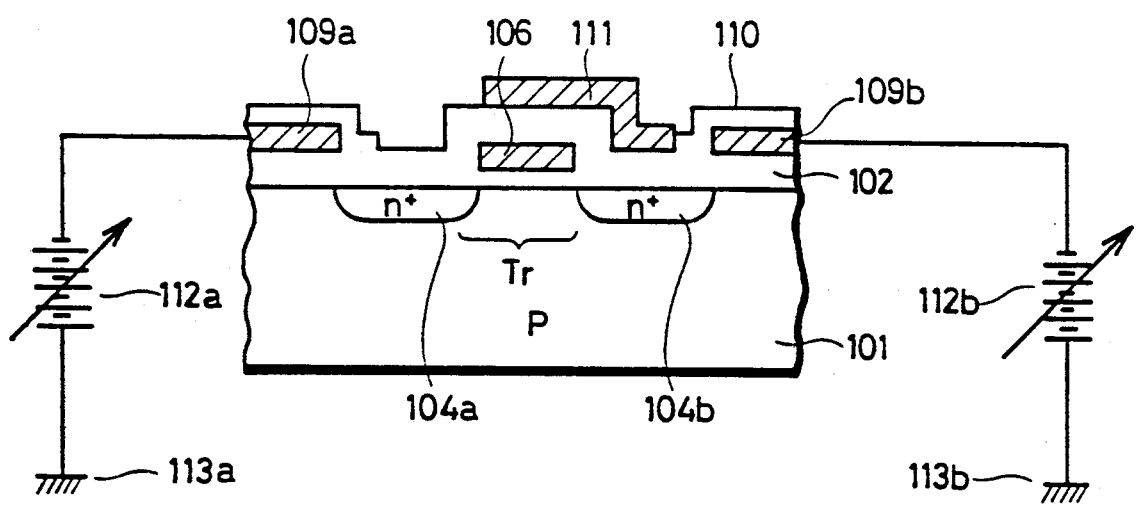
FIG. 11 is a cross-sectional view showing isolation by a conventional field shield electrode.
Figure 12A:
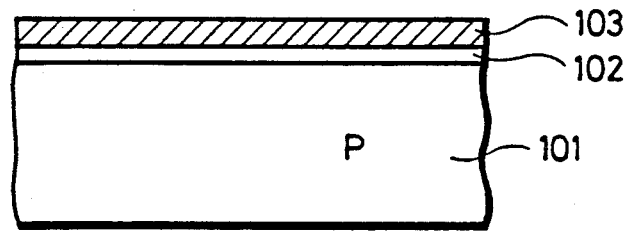
FIGS. 12A to 12F are schematic cross-sectional views showing the steps of a method for manufacturing a semiconductor device shown in FIG. 11.
Figure 12B:
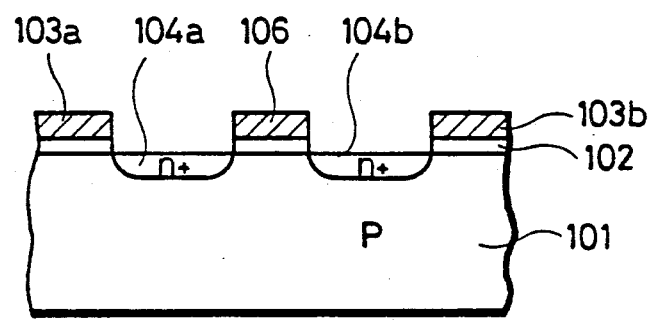
Figure 12C:
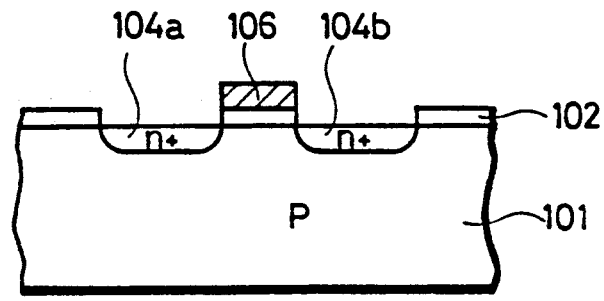
Figure 12D:
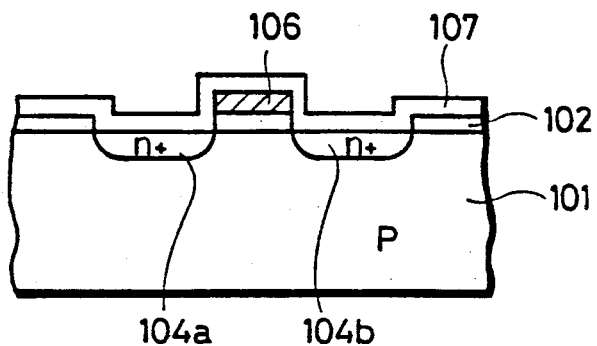
Figure 12E:
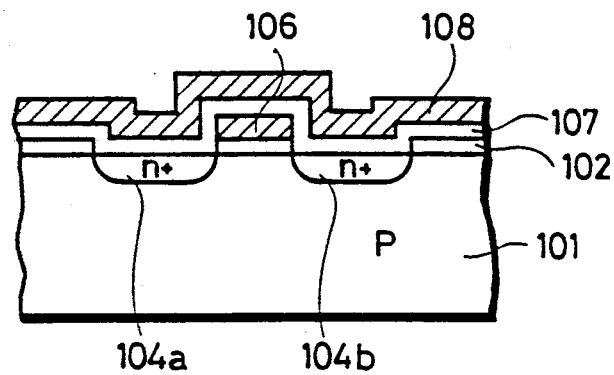
Figure 12F:
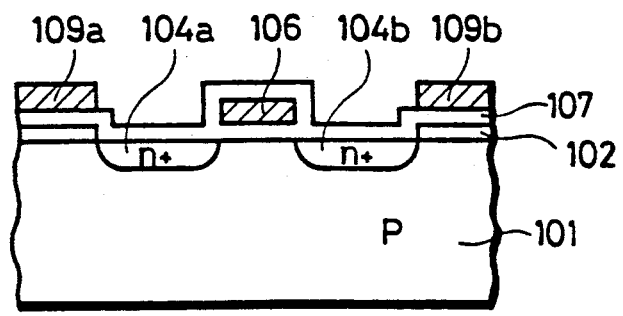
Figure 13A:
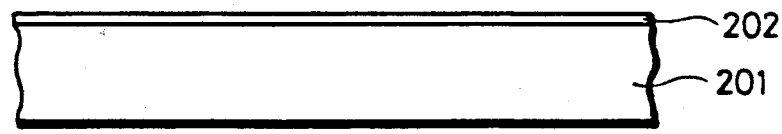
Figure 13B:
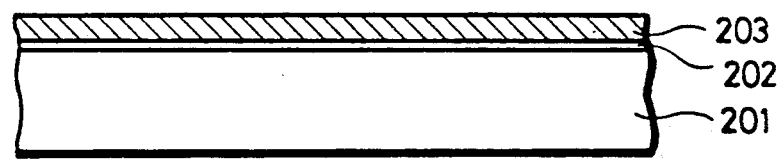
Figure 13C:
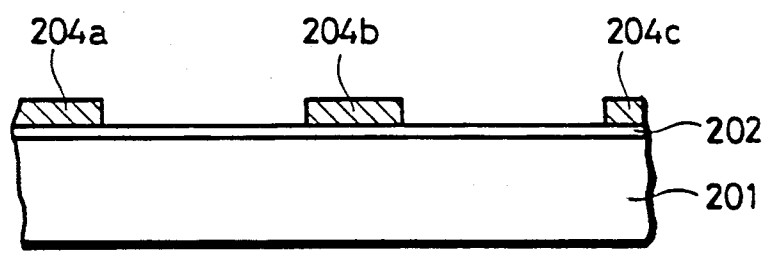
Figure 13D:
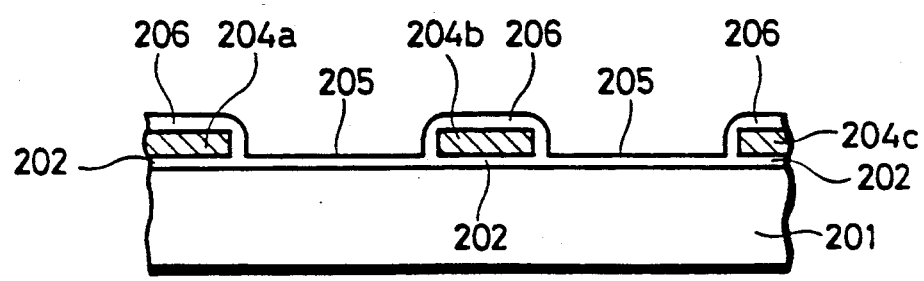

FIG. 8 is a plan view of a memory cell according to another embodiment shown in FIGS. 6A and 6B. FIG. 9A is a drawing showing X—X' section of FIG. 8 and FIG. 9B is a drawing showing Y—Y' section of FIG. 8. Referring to these drawings, the structure will be described.

Impurity regions 15c to 15e and 8c to 8e constituting LDD structure are formed at predetermined spacing on a main surface of a semiconductor substrate. A gate electrode 7b(7c) is formed through a gate oxide film 6 over a region between the impurity regions 15c(15e) and 8c(8e) and the impurity regions 15d and 8d. These impurity regions and the gate electrode constitute a memory transistor. These transistors are formed in an active region of the semiconductor substrate 1. Field shield electrodes 3 are formed through insulating film 2 over regions out of the active region of the semiconductor substrate 1. Interconnection layers 13 are formed through interlayer insulating film 4 and covered with interlayer insulating film 9. The gate electrode 7b(7c) is covered with an interlayer insulating film 9. A conductor layer 16a(16b) constituting a lower electrode of a capacitor is formed over the impurity region 15c with extending over the interlayer insulating film. A conductor layer 18a(18b) constituting an upper electrode of the capacitor is formed through a dielectric layer 17a (17b) over the conductor layer 16a(16b). An interlayer insulating film 19 is formed on the conductor layer 18a(18b). An opening is formed in the interlayer insulating film 9 on the impurity region 15d and constitutes a contact 23. A conductor layer 20 of a bit line is formed with patterning on the interlayer insulating film 19 and connected to the impurity region 15d through the contact 23.

According to this embodiment, since the active regions for the memory cells are ensurely separated in electrical view with the field shield electrode each other, the reliability of the device can be improved.

For instance, although in the above described embodiment, one of devices isolated by a field shield electrode is a field effect transistor, the present invention can be applied to another device comprising an impurity region provided the impurity region, together with a field shield electrode, constitutes a field transistor, to obtain the same effect.

Also, although in the above embodiment, a conductivity type is specified, the present invention is applied to a conductivity type opposite to the conductivity type.

Furthermore, although in the above described embodiment, a field shield electrode is formed of polysilicon, it may be formed of another material for the conductor, to obtain the same effect.

Additionally, although in the above described embodiment, a field shield electrode is connected to a negative potential or a ground potential, the field shield electrode may be electrically floating.

Additionally, in the above describe embodiment, a field shield electrode and each of impurity regions on both sides of a region under the field shield electrode are in an offset state in which they are spaced apart from each other by an offset length b. The offset length b can be made a minimum of zero, in which case improvement in isolation performance can be expected, as compared with the conventional example. In addition, although in the above described embodiment, a field shield electrode and each of impurity regions on both sides of a region under the field shield electrode are in an offset state, the field shield electrode and either one of the impurity regions may be in an offset state, to obtain the same effect.

As described in the foregoing, in the semiconductor device according to the present invention, a field transistor comprising a field shield electrode is an offset type transistor, so that the isolation capability by field shield isolation is further improved.

Additionally, in the method for manufacturing the semiconductor device according to the present invention, a thick insulating film is formed on sidewalls of a conductor and impurities are implanted utilizing the insulating film as a mask, an impurity region is not overlapped with a portion where the conductor is projected on a semiconductor substrate.

Although the present invention has been described and illustrated in detail, it is clearly understood that the same is by way of illustration and example only and is not to be taken by way of limitation. Accordingly, the spirit and scope of the present invention should be limited only by the terms of the appended claims.

What is claimed is:

1. A semiconductor device for electrically isolating a first device from a second formed on a common substrate therewith, comprising:
    a semiconductor substrate of a first conductivity type having a major surface,
    a conductor formed over a region of the semiconductor substrate and separated therefrom by an insulating film, said conductor having a lateral dimension extending at least in a lateral direction over said region of said semiconductor substrate,
    first and second impurity regions of a second conductivity type opposite to the first conductivity type, formed on opposite sides of said conductor at predetermined lateral spacing therefrom along the major surface of said semiconductor substrate, said lateral spacing being established by a lateral thickness of sidewalls of said insulating film extending from said opposite sides of said conductor, and
    said first impurity region being included in said first device and said second impurity region being included in said second device,
    further comprising an interlayer insulating film on said conductor, said interlayer insulating film having a predetermined vertical thickness,
    wherein said lateral thickness of said sidewalls of said insulating film extending from said opposite sides of said conductor corresponds to said predetermined vertical thickness of said interlayer insulating film,
    wherein said first and second impurity regions of said first and second devices are formed in said substrate and have a predetermined depth less than said predetermined thickness of said interlayer insulating film.

2. The semiconductor device according to claim 1, wherein
a potential of said semiconductor substrate is a ground potential, and said conductor is held at the ground potential.

3. The semiconductor device according to claim 1, wherein
said first conductivity type is a P-type conductivity type, a potential of said semiconductor substrate is a ground potential, and said conductor is held at the ground potential or a negative potential.

4. The semiconductor device according to claim 1, wherein
said first device comprises a first field effect transistor, and said first impurity region is a source or drain region of said first field effect transistor, and
said second device comprises a second field effect transistor, and said second impurity region is a source or drain region of said second field effect transistor.

5. The semiconductor device according to claim 4, wherein
each of said first and second field effect transistors has an LDD structure.

6. The semiconductor device according to claim 1, which further comprises
an interconnection layer formed above said conductor and separated therefrom by an interlayer insulating film.

7. A semiconductor device for electrically isolating a first device from a second device formed on a common substrate therewith, comprising:
a semiconductor substrate of a first conductivity type having a major surface,
a conductor formed over a region of the semiconductor substrate and separated therefrom by a first insulating film, said conductor having a lateral dimension extending at least in a lateral direction over said region of said semiconductor substrate,
first and second impurity regions of a second conductivity type opposite to the first conductivity type, formed on opposite sides of said conductor at predetermined lateral spacing therefrom along the major surface of said semiconductor substrate, said lateral spacing being established by a lateral thickness of sidewalls of said first insulating film extending from said opposite sides of said conductor, said first impurity region being included in said first device and said second impurity region being included in said second device, and
a second insulating film formed on said semiconductor substrate at least at one of the opposite ends of said conductor, said second insulating film defining a first lateral width which is determined based on a portion where said conductor is projected on the major surface of said semiconductor substrate and on an outer portion which is positioned in a lateral direction of said semiconductor substrate, wherein
a second width, which is determined based on an end portion of said first or second impurity region close to said conductor and on said outer portion, is shorter than said first width,
further comprising an interlayer insulating film on said conductor, said interlayer insulating film having a predetermined vertical thickness,
wherein said lateral thickness of said sidewalls of said insulating film extending from said opposite sides of said conductor corresponds to said predetermined vertical thickness of said interlayer insulating film,
wherein said first and second impurity regions of said first and second devices are formed in said substrate and have a predetermined depth substantially equal to said predetermined thickness of said interlayer insulating film.

8. The semiconductor device according to claim 7, wherein
said second width is substantially equal to a depth of said first or second impurity region.

9. A semiconductor device for electrically isolating a first device from a second device formed on a common substrate therewith, comprising:
a semiconductor substrate of a first conductivity type having a major surface,
a conductor formed over a region of the semiconductor substrate and separated therefrom by a first insulating film, said conductor having a lateral dimension extending at least in a lateral direction over said region of said semiconductor substrate,
first and second impurity regions of a second conductivity type opposite to the first conductivity type, formed on opposite sides of said conductor at predetermined lateral spacing therefrom along the major surface of said semiconductor substrate, said lateral spacing being established by a lateral thickness of sidewalls of said first insulating film extending from said opposite sides of said conductor, said first impurity region being included in said first device and said second impurity region being included in said second device, wherein
a conductivity type, of a region which is determined based on a portion where said conductor is projected on the major surface of said semiconductor substrate and on an end portion of said first and second impurity region close to said conductor, is said first conductivity type,
further comprising an interlayer insulating film on said conductor, said interlayer insulating film having a predetermined vertical thickness,
wherein said lateral thickness of said sidewalls of said insulating film extending from said opposite sides of said conductor corresponds to said predetermined vertical thickness of said interlayer insulating film,
wherein said first and second impurity regions of said first and second devices are formed in said substrate and have a predetermined depth less than said predetermined thickness of said interlayer insulating film.

10. A semiconductor device for electrically isolating a first device from a second formed on a common substrate therewith, comprising:
a semiconductor substrate of a first conductivity type having a major surface,
a conductor formed over a region of the semiconductor substrate and separated therefrom by an insulating film, said conductor having a length extending at least in a lateral direction over said region,
first and second impurity regions of a second conductivity type opposite to the first conductivity type, said first and second impurity regions formed on opposite sides of said conductor at predetermined lateral spacing therefrom and free of overlap between said conductor and said first and second impurity regions, said lateral spacing being established by sidewalls of said insulating film, said sidewalls having a lateral thickness extending from said opposite sides of said conductor in said lateral direction, and said first impurity region being included in said first device and said second impurity region being included in said second device, further comprising an interlayer insulating film on said conductor, said interlayer insulating film having a predetermined vertical thickness, wherein said lateral thickness of said sidewalls of said insulating film extending from said opposite sides of said conductor corresponds to said predetermined vertical thickness of said interlayer insulating film, wherein said first and second regions of said first and second devices are formed in said substrate and have a predetermined depth less than said predetermined thickness of said interlayer insulating film.

11. A semiconductor device for electrically isolating a first device from a second device formed on a common substrate, comprising:

a semiconductor substrate of a first conductivity type having a major surface, a conductor formed on an insulating film, said insulating film including sidewall portions extending laterally from opposite sides of said conductor over a region of said semiconductor substrate;

first and second impurity regions of a second conductivity type opposite to the first conductivity type, formed on the major surface of said semiconductor substrate and spaced laterally apart from the opposite sides of said conductor and said first and second impurity regions being established by lateral thickness of said insulating film sidewalls extending from the opposite sides of said conductor, said first impurity region being included in said first device and said second impurity region being included in said second device, further comprising an interlayer insulating film on said conductor, said interlayer insulating film having a predetermined vertical thickness, wherein said lateral thickness of said sidewall portions of said insulating film extending from said opposite sides of said field shield electrode corresponds to said predetermined vertical thickness of said interlayer insulating film, wherein said first and second impurity regions of said first and second devices are formed in said substrate and have a predetermined depth less than said predetermined thickness of said interlayer insulating film.

12. A field shield isolation device for isolating first and second field effect transistors having source/drain regions laterally spaced apart from each other along a common semiconductor substrate, said source/drain regions being of a first conductivity type opposite the conductivity type of said semiconductor substrate, said field shield isolation device comprising:

a field shield electrode formed on an insulating film extending at least in a lateral direction over a region of said semiconductor substrate between said source/drain regions of said first and second field effect transistors;

said source/drain regions of said first and second field effect transistors being laterally spaced apart from opposite sides of said field shield electrode by a distance established by the lateral thickness of sidewalls of said insulating film extending from said opposite sides, further comprising an interlayer insulating film on said field shield electrode, said interlayer insulating film having a predetermined vertical thickness, wherein said lateral thickness of said sidewalls of said insulating film extending from said opposite sides of said field shield electrode corresponds to said predetermined vertical thickness of said interlayer insulating film, wherein said source/drain regions of said first and second field effect transistors are formed in said substrate and have a predetermined depth less than said predetermined thickness of said interlayer insulating film.

13. A field shield isolation device as recited in claim 12, wherein said source/drain regions of said first and second field effect transistors includes respective portions respectively extending beneath said sidewalls towards said field shield electrode by a lateral distance corresponding to said predetermined depth, wherein said source/drain regions of said first and second field effect transistors extend towards said opposite sides of said field shield electrode by a distance less than said lateral thickness of said sidewalls and thus do not extend to a projection of said field shield electrode on said semiconductor substrate, thereby establishing said distance by which said source/drain regions are laterally spaced apart from said opposite sides of said field shield electrode.

* * * * *